United States Patent
Markut et al.

(10) Patent No.: US 11,164,748 B2
(45) Date of Patent: Nov. 2, 2021

(54) METHOD AND DEVICE FOR PLATING A RECESS IN A SUBSTRATE

(71) Applicant: Semsysco GmbH, Salzburg (AT)

(72) Inventors: Franz Markut, St. Georgen (AT); Thomas Wirnsberger, Seeboden (AT); Oliver Knoll, Salzburg (AT); Andreas Gleissner, Döbriach (AT); Harald Okorn-Schmidt, Klagenfurt (AT); Philipp Engesser, Villach (AT)

(73) Assignee: Semsyso GMBH, Salzburg (AT)

( * ) Notice: Subject to any disclaimer, the term of this patent is extended or adjusted under 35 U.S.C. 154(b) by 0 days.

(21) Appl. No.: 16/256,194

(22) Filed: Jan. 24, 2019

(65) Prior Publication Data
US 2019/0228975 A1    Jul. 25, 2019

(30) Foreign Application Priority Data

Jan. 25, 2018  (GB) .................................... 1801201

(51) Int. Cl.
| | |
|---|---|
| *H01L 21/288* | (2006.01) |
| *C25D 17/00* | (2006.01) |
| *C25D 21/12* | (2006.01) |
| *C25D 5/02* | (2006.01) |
| *C25D 7/12* | (2006.01) |

(Continued)

(52) U.S. Cl.
CPC .......... *H01L 21/2885* (2013.01); *B05C 3/005* (2013.01); *B05C 3/02* (2013.01); *B05C 9/14* (2013.01); *C25D 5/003* (2013.01); *C25D 5/02* (2013.01); *C25D 5/34* (2013.01); *C25D 7/123* (2013.01); *C25D 17/001* (2013.01);

(Continued)

(58) Field of Classification Search
None
See application file for complete search history.

(56) References Cited

U.S. PATENT DOCUMENTS

| 5,830,805 A | 11/1998 | Shacham-Diamand et al. |
| 2001/0037764 A1* | 11/2001 | Nakashima ....... H01L 21/67167 118/70 |

(Continued)

FOREIGN PATENT DOCUMENTS

| CN | 107 833 858 | 3/2018 |
| JP | 2011 096 800 | 5/2011 |

OTHER PUBLICATIONS

European Search Report dated Sep. 10, 2019 for EP19150854.

(Continued)

*Primary Examiner* — Jethro M. Pence
(74) *Attorney, Agent, or Firm* — Emerson, Thomson, Bennett, LLC; Daniel A. Thomson

(57) ABSTRACT

The invention relates to a method for plating a recess in a substrate, a device for plating a recess in a substrate and a system for plating a recess in a substrate comprising the device. The method for plating a recess in a substrate comprises the following steps:
a) Providing a substrate with a substrate surface comprising at least one recess,
b) applying a replacement gas to the recess to replace an amount of ambient gas in the recess to at least partially clear the recess from the ambient gas,
c) applying a processing fluid to the recess, wherein the replacement gas dissolves in the processing fluid to at least partially clear the recess from the replacement gas, and
d) plating the recess.

12 Claims, 6 Drawing Sheets

(51) Int. Cl.
- C25D 5/34 (2006.01)
- C25D 21/04 (2006.01)
- C25D 5/00 (2006.01)
- H01L 21/768 (2006.01)
- H05K 3/42 (2006.01)
- B05C 3/00 (2006.01)
- B05C 3/02 (2006.01)
- B05C 9/14 (2006.01)

(52) U.S. Cl.
CPC ............. *C25D 21/04* (2013.01); *C25D 21/12* (2013.01); *H01L 21/76877* (2013.01); *H05K 3/42* (2013.01)

(56) References Cited

U.S. PATENT DOCUMENTS

2002/0020627 A1* 2/2002 Kunisawa ........... H01L 21/6715 205/96
2003/0075808 A1* 4/2003 Inoue ................ H01L 21/76874 257/774
2008/0149487 A1 6/2008 Lee
2008/0296166 A1 12/2008 Woods et al.

OTHER PUBLICATIONS

UK Intellectual Property Office, "Combined Search and Examination Report," dated Jul. 16, 2018.
UK Intellectual Property Office, "Examination Report," dated Sep. 13, 2018.
UK Intellectual Property Office, "Examination Report," dated Dec. 4, 2018.
UK Intellectual Property Office, "Examination Report," dated Aug. 21, 2020.
EP Intellectual Property Office, "Extended Search Report," dated Sep. 17, 2019.
European Patent Office; "Examination Report" EP 191 508 54.8; dated May 3, 2021.

* cited by examiner

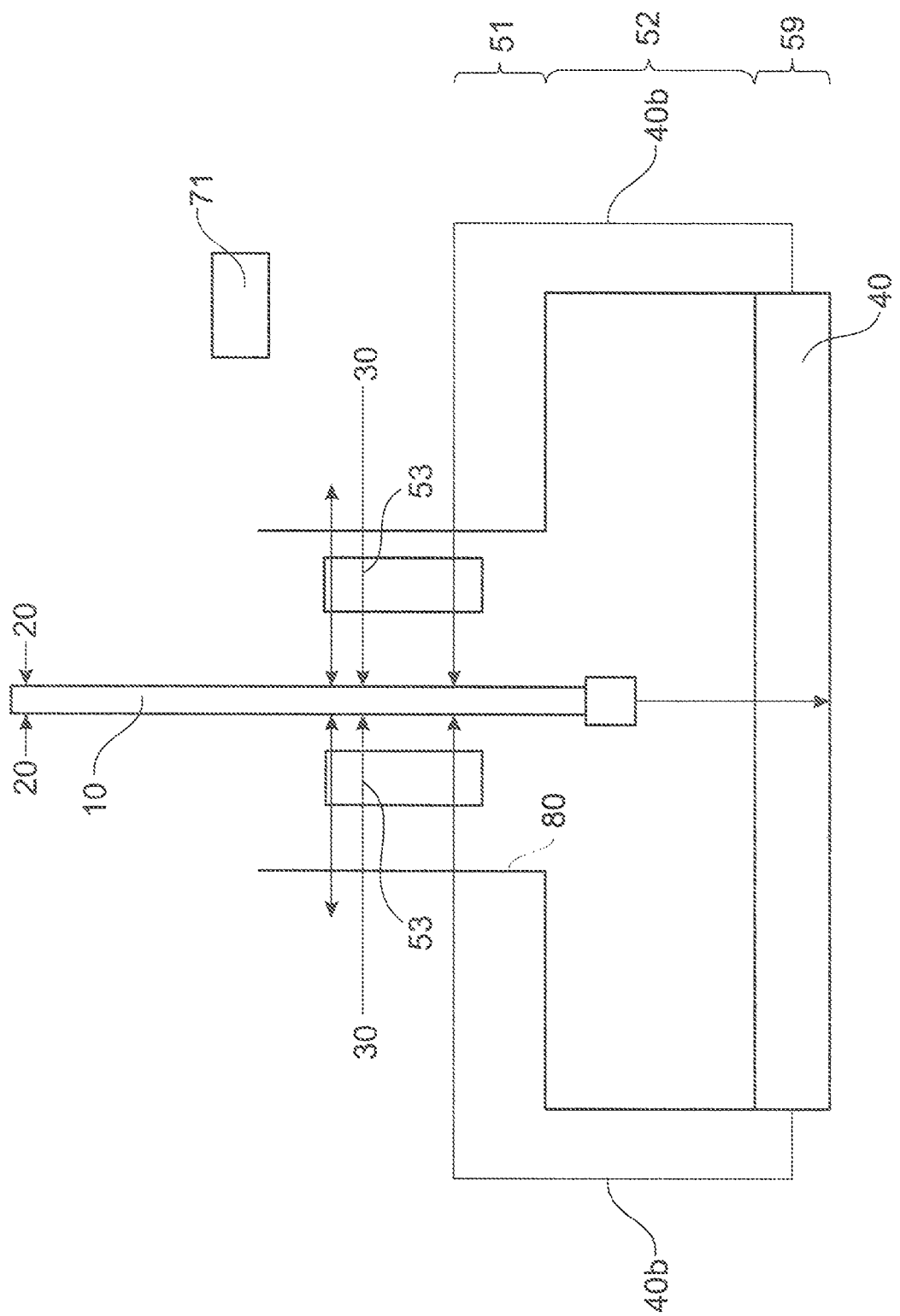

METHOD AND DEVICE FOR PLATING A RECESS IN A SUBSTRATE

FIELD OF THE INVENTION

The invention relates to a method for plating a recess in a substrate, a device for plating a recess in a substrate and a system for plating a recess in a substrate comprising the device.

BACKGROUND OF THE INVENTION

There are plenty of manufacturing processes, in which small recesses or openings are to be plated or filled by a substance. Thereby difficulties arise, because the surrounding ambient air, in which the substrates are handled, usually fills these small recesses. This ambient air forms a barrier, which deteriorates or prevents a continuous plating or filling of the recesses. A discontinuous or even interrupted coating or filling leads to e.g. loose contacts or even interrupted electrical circuits. A reliability, functionality and life span of a device with such plated or filled recesses is reduced.

Conventionally, ambient air is removed by means of sub-atmospheric pressure or vacuum in a pressure-controlled chamber. The subsequent plating or filling of the recesses has then to be done without interrupting the sub-atmospheric pressure or vacuum. Such procedure is complex as well as time and cost intensive. The plating or filling in sub-atmospheric pressure or vacuum can be replaced by prior rinsing of the recesses under various pressure conditions with an inert or degassed pre-wetting liquid, which however still keeps the procedure complex, time and cost intensive.

A corresponding pre-wetting apparatus method and design is disclosed in US 2015/179458 A1. The method of electroplating a layer of copper on a wafer substrate comprises (a) providing the wafer substrate having an exposed metal layer on at least a portion of its surface to a pre-wetting process chamber; (b) contacting the wafer substrate with a pre-wetting fluid under subatmospheric pressure, the pre-wetting fluid comprising water and copper ions, to form a layer of pre-wetting fluid on the wafer substrate; (c) contacting the pre-wetted wafer substrate with a plating solution, the plating solution comprising copper ions, to electroplate a layer of copper on the wafer substrate, wherein the concentration of copper ions in the pre-wetting fluid is greater than the concentration of copper ions in the plating solution.

SUMMARY OF THE INVENTION

Hence, there may be a need to provide an improved method and device for plating a recess in a substrate, which are in particular less complex.

In the present invention, the problem is solved by the subject-matters of the independent claims, wherein further embodiments are incorporated in the dependent claims. It should be noted that the aspects of the invention described in the following apply also to the method for plating a recess in a substrate, the device for plating a recess in a substrate and the system for plating a recess in a substrate comprising the device.

According to the present invention, a method for plating a recess in a substrate is presented. The method comprises the following steps:
a) Providing a substrate with a substrate surface comprising at least one recess,
b) applying a replacement gas to the recess to replace an amount of ambient gas in the recess to at least partially clear the recess from the ambient gas,
c) applying a processing fluid to the recess, wherein the replacement gas dissolves in the processing fluid to at least partially clear the recess from the replacement gas, and
d) plating the recess.

The method for plating a recess in a substrate according to the present invention may reduce or replace the ambient gas in the recess of the substrate by the replacement gas. The replacement gas may be selected to easily dissolve in the subsequently applied processing fluid, so that also the replacement gas is reduced or removed from the recess. The removal of the ambient gas and/or the replacement gas may be done in particular fast and/or in particular complete. Also any kind of (harmful) residues to the process and/or by-products may be avoided. As a result, a reduced or even no gaseous barrier at all prevents or deteriorates a continuous plating or filling of the recess.

Thereby, the method for plating a recess in a substrate according to the present invention works at atmospheric pressure and without any application of sub-atmospheric pressure or vacuum with associated needs for expensive and complex equipment parts, which makes the method less complex, time and cost intensive when compared to the conventional methods.

According to the present invention, also a premium quality plating or filling method is provided, which enables the manufacturing of premium quality devices with superior electrical and/or mechanical properties, reliability and life span.

The plating may be any chemical and/or electrolytic surface treatment as, e.g., material deposition, galvanized coating, chemical or electrochemical etching, anodal oxidation, metal separation or the like. The plating may be an at least partial filling of the recess with an alloy or a metal and in particular with copper, nickel, indium or cobalt. The plating may be a partial or an essentially complete plating and filling of the recess. The plating may also comprise an at least partial coating of sidewalls of the recess and/or the substrate surface.

The substrate may comprise a conductor plate, a semiconductor substrate, a film substrate, an essentially plate-shaped, metal or metallized workpiece or the like. The substrate may be held in a substrate holder.

The substrate surface may also comprise a plurality of recesses. The substrate may be, e.g., a perforated plate. The substrate surface may be unmasked or at least partially masked.

The recess may be an opening, a hole, a through hole, a blind hole, a slit or the like of circular, angular or any other geometrical shape and made by any kind of manufacturing method. The recess may have a diameter or lateral dimension between 0.01 and 1000 µm, preferably between 0.015 and 800 µm and more preferably between 0.02 and 500 µm.

The ambient gas may be air, a mixture of mainly nitrogen and oxygen, or any other kind of gas surrounding the substrate surface, e.g., an inert gas.

The dissolution of the replacement gas in the processing fluid may be achieved in that the replacement gas has at the chosen processing temperature a higher solubility in the processing fluid than the ambient gas. The dissolution of the replacement gas in the processing fluid may also be achieved in that the replacement gas has an equal or lower solubility in the processing fluid than the ambient gas and the replacement gas and/or the processing fluid comprises an initiating agent to initiate a chemical reaction between the replacement gas and the processing fluid. Both will be described in more detail further below.

The replacement gas may be applied to the recess to reduce the ambient gas in the recess or to essentially completely replace the ambient gas in the recess. The at least partial clearing of the recess can be understood in that the replacement gas and the processing fluid reduce or essentially remove any gaseous barrier in the recess before plating the recess.

In an example, the replacement gas has at room temperature as processing temperature a higher solubility in the processing fluid than the ambient gas. In an example, the ambient gas is air and Henry's law solubility constant $H^{cp}$ of the replacement gas in the processing fluid at the chosen processing temperature, here at room temperature, and 1 atm is larger than $6.4 \times 10^{-6}$ mol m$^{-3}$ Pa$^{-1}$, preferably equal to or larger than $1.2 \times 10^{-5}$ mol m$^{-3}$ Pa$^{-1}$ and more preferably equal to or larger than $3.3 \times 10^{-4}$ mol m$^{-3}$ Pa$^{-1}$. These values are in the range of the Henry's law solubility constants of $N_2$, $O_2$ and $CO_2$. The Henry's law solubility constant $H^{cp}$ is defined as a concentration c of a species in an aqueous phase divided by a partial pressure p of that species in a gas phase under equilibrium conditions. The replacement gas may be or comprise $CO_2$ and the processing fluid may be essentially water. After the gas exchange the substrate may be sprayed with the processing fluid or immersed into the processing fluid.

In another example, the replacement gas has a lower solubility in the processing fluid than the ambient gas. The replacement gas may comprise an initiating agent to initiate a chemical reaction between the replacement gas and the processing fluid. Alternatively or additionally, the processing fluid may comprise an initiating agent to initiate a chemical reaction between the replacement gas and the processing fluid. In an example, the chemical reaction between the replacement gas and the processing fluid continuously consumes the replacement gas so that an absorption capacity of the processing fluid will not be reached until the replacement gas has been sufficiently removed from the recess. In an example, the replacement gas is an easily oxidizable organic vapour and the processing fluid is water containing $O_3$ (Ozone) as an initiating agent.

In the microelectronics and semiconductor industry, various processes can be used for plating, filling or otherwise surface treating wafer surfaces. For example, a conductive material can be deposited on a previously patterned wafer surface. The plating or filling may comprise chemical and/or electrolytic surface treatment techniques, which may comprise the following steps: a substrate to be processed is attached to a substrate holder, immersed into an electrolytic plating fluid and serves as a cathode. An additional electrode is immersed into the plating fluid and serves as an anode. A direct current is applied to the plating fluid and dissociates metal ion complexes or salts in the electrolyte. The generated or released positive metal ions then migrate to the cathode, where they plate in more or less metallic state on the substrate acting as the cathode. In addition, also electroless electrolytic deposition or pulse electroplating/electrodeposition and similar techniques are possible.

In an example, the processing fluid is a plating fluid and the substrate is immersed in the plating fluid. The substrate may be partially or essentially completely immersed in the plating fluid. In an example, the plating fluid is an electrolyte of an electrochemical deposition system. In an example, the plating fluid is an acid electrolyte with a pH value smaller or close to 7. In an example, the replacement gas comprises or is $SO_2$ and the processing fluid comprises or is $H_2SO_4$. In this example, a prior, low pressure rinsing or pre-wetting step to remove the ambient gas before plating is not necessary, which makes the present method for plating a recess in a substrate in particular efficient and cheap.

In another example, the processing fluid is a rinsing fluid and the recess is rinsed by the rinsing fluid. In an example, the replacement gas dissolved in the processing fluid forms a chemically reactive modification fluid, which modifies the surface of the recess. In an example, the chemically reactive modification fluid is an acid or a base for cleaning or etching the surface of the recess. This integrated surface etching and preparation step further improves the present method for plating a recess in a substrate and makes it in particular efficient. In an example, the replacement gas is or comprises $NH_3$, $SO_2$, $NO_2$, HCl, HF or other gases capable of forming reactive liquids to chemically etch exposed materials, e.g. Acidic Acid, Citric Acid, Trifluoroacetic Acid and many other acid derivatives of organic molecules, and the processing fluid is essentially water or a solvent. In this example, this rinsing or pre-wetting step perfectly prepares the recess for the subsequent plating step.

The replacement gas may comprise a vapor of at least one organic chemical or a mixture of several thereof. The replacement gas may comprise at least one of a group of Ethylene, Methane, Ethan, Propane, Butane, 2-Methylpropane, functionalized organic vapors as e.g. alcohols and acids with high vapor pressures (e.g. Methanol, Ethanol, isopropyl alcohol, acetic acid, etc.) and the like.

The processing fluid may comprise water, watery mixes with inorganic media as e.g. acids and bases, organic solvents, organic acids and bases, mixtures of two or more organic solvents or organic acids or organic bases, mixtures of water with one or more organic solvents or organic acids or organic bases, isopropyl alcohol, tetramethylammonium hydroxide, N-Methyl-2-pyrrolidon and the like.

A combination of replacement gas/processing fluid may be one of a group of CO/water, $NH_3$/water, $NH_3$/TMAH (tetramethylammonium hydroxide), $SO_2$/sulphuric acid, HF/water, HCl water, $Cl_2$/water, $Br_2$/water, $C_2H_4$/water, $SO_2/H_2O$, $O_2$/water, $H_2S$/water, $CH_4$/water, $C_2H_6$/water, $C_3H_8$/water, $C_4H_{10}$/water, Ar/water, Kr/water, Xe/water, $O_3$/water, $N_2O$/water, NO/water, $H_2Se$/water, $Cl_2O$/water, $ClO_2$/water and the like. The combination may be selected and adapted to further provide beneficial effects to the present plating method, as e.g. an increased speed, a more continuous plating, a better adhesion, an improved crystalline and/or amorphous state of the deposit, or achievement of other improved material properties, and the like.

The combination of replacement gas/processing fluid may further comprise organic additives as e.g. organic acids, corrosion inhibitors, complexation reagents and/or the like.

According to the present invention, also a device for plating a recess in a substrate is presented. The device for plating a recess comprises a replacement gas unit, a processing fluid unit and a plating unit.

The replacement gas unit is configured to apply a replacement gas to a recess in a substrate to replace an amount of ambient gas in the recess to at least partially clear the recess from the ambient gas. The replacement gas may be continuously circulated.

The processing fluid unit is configured to apply a processing fluid to the recess, wherein the replacement gas dissolves in the processing fluid to at least partially clear the recess from the replacement gas.

The plating unit is configured to plate the recess in the substrate.

The device for plating a recess in a substrate according to the present invention may reduce or replace the ambient gas in the recess of the substrate by the replacement gas. The replacement gas may be selected to easily dissolve in the subsequently applied processing fluid. As a result, a reduced or even no gaseous barrier permits or improves a continuous and essentially complete plating or filling of the recess. Thereby, the device for plating a recess in a substrate according to the present invention works without any application of sub-atmospheric pressure or vacuum, which makes the device less complex and cost intensive when compared to conventional devices. The device for plating a recess in a substrate according to the present invention may be used for vertical, horizontal or any other angled geometry electrolytic plating systems. For example, in a vertical plating chamber, the substrate may be vertically inserted into the plating fluid and in a horizontal plating chamber, the substrate may be horizontally inserted into the plating fluid.

The replacement gas unit may be provided spaced apart or at a distance from the processing fluid or directly above and in particular in contact with the processing fluid. The replacement gas unit may be attached to a replacement chamber, may float in the processing fluid and in particular float on top of a plating fluid surface or may be attached to a substrate holder. The replacement gas unit may be guided magnetically and/or air centered.

In an example, the replacement gas unit comprises a replacement gas chamber, which may be filled with the replacement gas. In an example, the replacement gas unit comprises at least one gas inlet and in particular at least a gas nozzle configured to generate a replacement gas cushion or replacement gas curtain to be passed by the recess of the substrate. The replacement gas chamber may further comprise a drain and in particular a controlled drain by means of implementing a device or control system enabling the adjustment of flow rates through the drain. The replacement gas chamber may comprise an exhaust and in particular a controlled exhaust by means of implementing a device or control system enabling the adjustment of flow rates through the exhaust. The exhaust may enable the use of the device for plating a recess in a substrate according to the present invention applying reactive and/or toxic gases and/or liquids. In such case, the device for plating may be further provided with gas sensors and/or leak detectors.

In an example, the processing fluid is or comprises the plating fluid and the processing fluid unit comprises a reservoir of the processing fluid as plating fluid, which is configured for a chemical and/or electrolytic surface treatment of the substrate and in which the substrate is immersed. The processing fluid unit then is or comprises the plating unit and the processing fluid is or comprises the plating fluid configured to plate the recess in the substrate. The device for plating a recess may then further comprise a guiding unit configured to guide the substrate from the replacement gas unit to the plating unit.

In another example, the processing fluid is not and does not comprise the plating fluid. The processing fluid unit is a rinsing unit and the processing fluid is a rinsing fluid configured to rinse the recess. The rinsing fluid may be continuously circulated. The processing fluid unit then comprises at least one media inlet and in particular at least a media nozzle configured to generate a processing fluid cushion or curtain to be passed by the substrate.

The gas inlet and/or the media inlet may be provided spaced apart or directly above the processing fluid level and in particular in contact with the processing fluid. After the substrate is subjected to the replacement gas and the processing fluid, it may be immersed in an additional plating fluid contained in the reservoir of the processing fluid unit configured to plate the recess. The device for plating a recess may further comprise another guiding unit configured to guide the substrate from the replacement gas unit and the rinsing unit to the plating unit.

In particular for a vertical plating system, the plating device may comprise an inlet portion, in which the substrate is inserted into the replacement gas chamber and which comprises the gas inlet by which the substrate is subjected to the replacement gas. The gas inlet may be an opening, bore or a slit. When the at least one recess of the substrate is filled by the replacement gas, the substrate may be inserted into the processing fluid contained in the reservoir. The replacement gas may then dissolve in the processing fluid and the processing fluid consequently fills the recess.

Additionally or instead, a media inlet may be arranged in the inlet portion e.g. close to the gas inlet or may be even integrated in the gas inlet. The substrate can be subsequently subjected to the replacement gas, subjected to the processing fluid and immersed into e.g. a plating liquid in the reservoir. The media inlet may be at least a media nozzle, a media nozzle array, at least a media drain and/or a media drain array. The media nozzle(s) or the media drain(s) may be cleaned from e.g. dried processing fluid crystals by immersing the nozzle(s) or the drain(s) into the processing fluid or plating liquid in the reservoir and/or by increasing a flow of processing fluid.

In an example, the device for plating a recess further comprises a drive unit arranged at or in the inlet portion and configured to move the gas inlet and/or the media inlet relative to the substrate. The gas inlet and/or the media inlet may approach the substrate when the substrate passes through the inlet portion when being inserted into the chamber. The gas inlet and/or the media inlet may be driven between a proximal position relative to the substrate and a distal position relative to the substrate. The proximal position may be close to or nearly in contact with the substrate. The distal position may be more distanced from the substrate than the proximal position. The drive unit may be configured to move the gas inlet and/or the media inlet only relative and perpendicular to the substrate and not relative and perpendicular to the processing fluid. In an example, the drive unit, the gas inlet and/or the media inlet is/are arranged at a distance to the processing or plating fluid.

In particular for a horizontal plating system, the substrate may be inserted into the chamber, the chamber may be filled with the replacement gas and the substrate may be immersed into the processing fluid. The replacement gas may be provided via chamber walls or a substrate holder, in both cases with at least one opening, bore or slit. The replacement gas may also be provided via an arm-shaped member. The replacement gas unit then is or comprises the arm-shaped member, wherein the arm-shaped member and the substrate are moveable and in particular rotatable relative to each other. The movement between the substrate and the arm-shaped member may be a linear scanning motion, a record player like motion or the like. The arm-shaped member may be configured to apply the replacement gas, the rinsing fluid, an initiating agent and/or a chemically active substance to the recess and/or the substrate. These gases and/or fluids may be applied from an outer, larger dimension or circumference to an inner, smaller dimension or circumference of the substrate.

In particular for an electrolytic plating system, the substrate may be inserted into an empty chamber and the chamber may be closed and filled with the replacement gas and/or the processing fluid e.g. from below. The device for plating a recess may therefore comprise a control unit configured to essentially close the plating unit relative to the surrounding environment. The control unit may instead or additionally be configured to fill the plating unit with the replacement gas and/or the plating fluid. The control unit may be a processor.

In particular for a high speed plating system, the replacement gas unit and in particular the gas inlet and/or the media inlet may be integrated into a substrate holder configured to hold the substrate. The replacement gas unit and in particular the gas inlet and/or the media inlet may be arranged at a top portion of the substrate holder and in particular in the inlet portion of the plating device. The substrate holder may hold one or two substrates (e.g. one substrate on each side of the substrate holder).

The following can be used for all kinds of plating systems. In an example, the device for plating a recess further comprises a temperature unit configured to control a change of a processing temperature of the processing fluid. The temperature unit may be configured to increase and/or decrease the processing temperature of the processing fluid. It may be a heating and/or cooling device. The temperature unit may be further configured to detect the temperature of the processing fluid. The temperature unit may be configured to increase the temperature of the processing fluid from room temperature to a range between about 25 and 80° C., preferably to a range between about 25 and 70° C. and more preferably to a range between about 25 and 50° C. The temperature unit may be also configured to decrease the temperature of the processing fluid from room temperature to a range between about 0 and 25° C., preferably to a range between about 1 and 23° C. and more preferably to a range between about 4 and 20° C. When applying processing fluids with appropriately low freezing points also temperature adjustments of the processing fluid below 0° C. can lead to improved process performance. By applying two temperature control units, one for the processing fluid as a rinsing fluid and one for the processing fluid as plating fluid, two different temperatures according to the before mentioned temperature ranges can be applied. In an example, the temperature of the rinsing fluid is reduced below room temperature to typically increase the solubility of the replacement gas in the rinsing fluid, while the temperature in the plating fluid is increased from room temperature to an elevated temperature to e.g. increase the speed of the process, improve the solubility parameters and the like.

In an example, the device for plating a recess further comprises a composition control unit configured to control a change of the chemical property of the replacement gas and/or the processing fluid. The composition control unit may be further configured to detect the chemical property of the replacement gas and/or the processing fluid. The chemical property of the replacement gas and/or the processing fluid may be a composition, a pH value, an amount of an additive or the like. The change of the chemical property may be done by adding some component based on the direct or indirect feedback from the composition control unit.

According to the present invention, also a system for plating a recess in a substrate is presented. The system for plating a recess comprises a device for plating a recess in a substrate as described above and a device control. The device control is configured to control a gas replacement in a recess of a substrate, an application of a processing fluid to the recess and/or a plating of the recess. The device control may be a processor.

Devices, systems and methods for plating a recess in a substrate as described above are suitable for processing structured semi-conductor substrates, conductor plates, and film substrates, as well as for processing entire surfaces of planar metal and metallized substrates. Devices, systems and methods for plating a recess in a substrate as described above may also be used for a production of large surface photoelectric panels for solar energy generation, or large-scale monitor panels.

It shall be understood that the device, the system and the method for plating a recess in a substrate according to the independent claims have similar and/or identical preferred embodiments, in particular, as defined in the dependent claims. It shall be understood further that a preferred embodiment of the invention can also be any combination of the dependent claims with the respective independent claim.

These and other aspects of the present invention will become apparent from and be elucidated with reference to the embodiments described hereinafter.

BRIEF DESCRIPTION OF THE DRAWINGS

Exemplary embodiments of the invention will be described in the following with reference to the accompanying drawings:

FIG. 4 shows schematically and exemplarily an embodiment of a device according to the invention for plating a recess in a substrate.

DETAILED DESCRIPTION OF EMBODIMENTS

Figure 1:
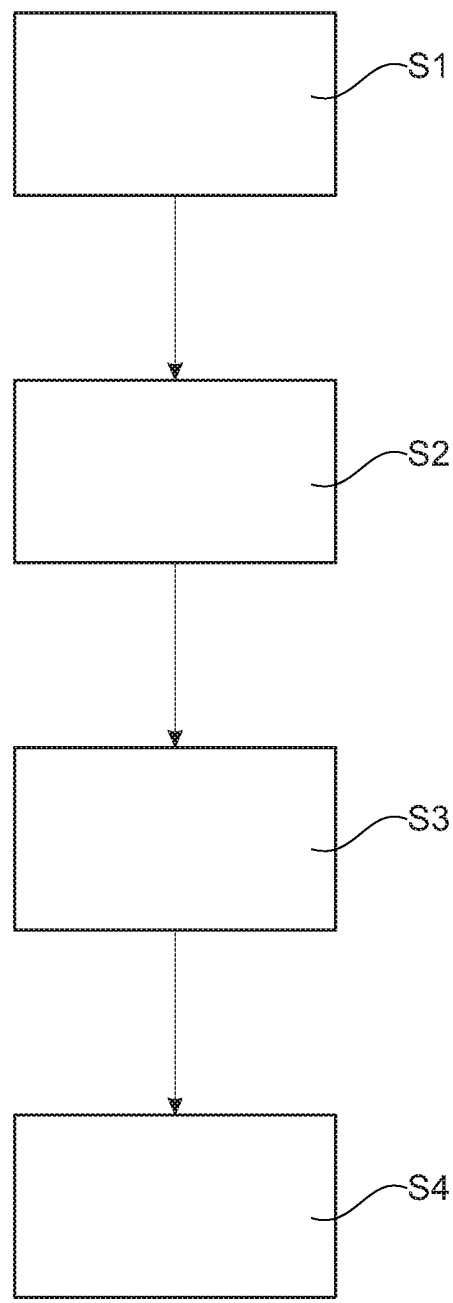
FIG. 1 shows a schematic overview of the steps of the method for plating a recess in a substrate according to the invention.

According to the present invention, a method for plating a recess in a substrate 10 is presented. FIG. 1 shows a schematic overview of the steps of the method for plating a recess in a substrate 10. It comprises the following steps:

In a first step S1, providing a substrate 10 with a substrate surface 11 comprising a plurality of recesses.

In a second step S2, applying a replacement gas 30 to the recesses to replace an amount of ambient gas 20 in the recesses to clear the recesses from the ambient gas 20.

In a third step S3, applying a processing fluid 40 to the recesses, wherein the replacement gas 30 dissolves in the processing fluid 40 to clear the recesses from the replacement gas 30.

In a fourth step S4, plating the recesses.

FIGS. 2 to 7 show schematic and exemplary embodiments of a system 70 and a device 50 according to the invention for plating a recess in a substrate 10. The system 70 for plating a recess comprises a device control 71 and a device 50 for plating a recess in a substrate 10 as described further below. The device control 71 controls a gas replacement in a recess of a substrate 10, an application of a processing fluid 40 to the recess and/or a plating of the recess. The device control 71 may be a processor.

The device 50 for plating a recess comprises a replacement gas unit 51, a processing fluid unit 52 and a plating unit 59. The replacement gas unit 51 applies the replacement gas 30 to one or more recesses in the substrate 10 to replace the ambient gas 20 in the recesses. The replacement gas 30 may be continuously circulated. The processing fluid unit 52 applies the processing fluid 40 to the recesses, wherein the replacement gas 30 dissolves in the processing fluid 40 to clear the recesses from the replacement gas 30. The plating unit 59 then plates the recesses in the substrate 10.

The method, system 70 and device 50 for plating a recess in a substrate 10 according to the present invention may essentially replace the ambient gas 20 in the recesses of the substrate 10 by the replacement gas 30. As a result, essentially no gaseous barrier prevents a continuous and essentially complete plating or filling of the recesses. Thereby, the method, system 70 and device 50 for plating a recess in a substrate 10 according to the present invention works at atmospheric pressure and without any application of sub-atmospheric pressure or vacuum with associated needs for expensive and complex equipment parts, which makes the method less complex, time and cost intensive when compared to the conventional methods. In addition, a premium quality method, system 70 and device 50 are provided, which enable the manufacturing of premium quality products with superior electrical and/or mechanical properties, reliability and life span.

Figure 2:
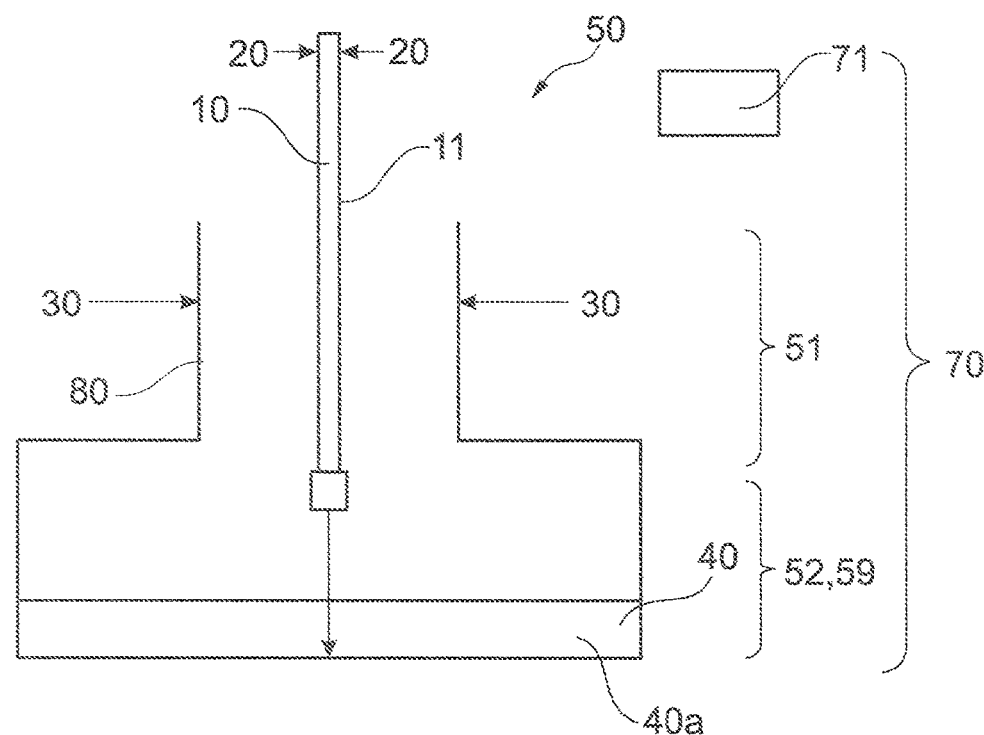
FIG. 2 shows schematically and exemplarily an embodiment of a system and a device according to the invention for plating a recess in a substrate.
Figure 3:
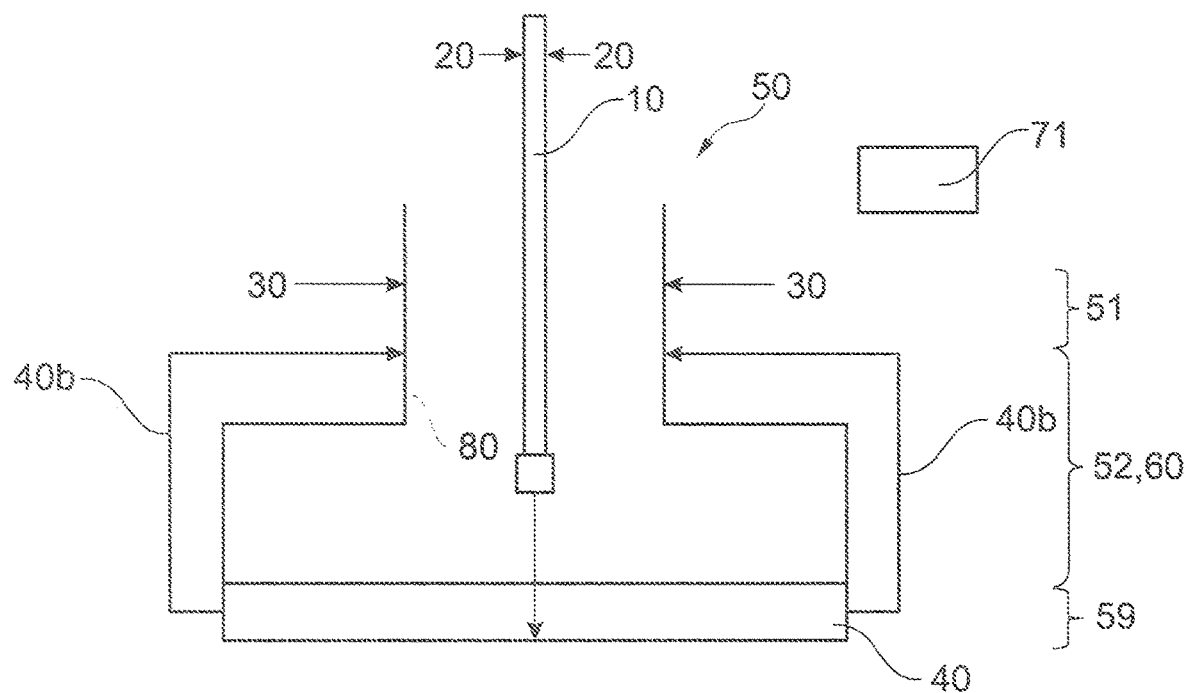
FIG. 3 shows schematically and exemplarily an embodiment of a device according to the invention for plating a recess in a substrate.

As stated above, the device 50 for plating a recess comprises the replacement gas unit 51, which applies the replacement gas 30 to the recesses in the substrate 10 to replace the ambient gas 20. As shown in FIGS. 2 to 4, the replacement gas unit 51 or inlet portion is arranged spaced apart, at a distance and not in contact with the processing fluid 40. The replacement gas unit 51 comprises or is formed as a replacement gas chamber, which can be filled with the replacement gas 30. The replacement gas unit 51 or the replacement gas chamber comprises here several gas inlets in form of gas nozzles 53 (FIG. 4) spaced apart from the processing fluid 40. They are configured to generate a replacement gas cushion or replacement gas curtain to be passed by the substrate 10 and its recesses.

As also stated above, the device 50 for plating a recess comprises the processing fluid unit 52, which applies the processing fluid 40 to the recesses, so that the replacement gas 30 dissolves in the processing fluid 40 and clears the recesses from the replacement gas 30. There are at least two options:

First and as shown in FIG. 2, the processing fluid unit 52 comprises a reservoir of a plating fluid 40a as processing fluid 40 for filling and plating the recesses (and the substrate 10). The substrate 10 is immersed in the plating fluid 40a. The processing fluid unit 52 is then a plating unit 59 and the processing fluid 40 is the plating fluid 40a for plating the recesses.

Second and as shown in FIGS. 3 and 4, the processing fluid 40 is not the plating fluid 40a, but a rinsing fluid 40b to rinse the recesses. The processing fluid unit 52 is then a rinsing unit 60 and comprises several media inlets and in particular media nozzles for the rinsing fluid 40b to generate a processing or rinsing fluid cushion or a processing or rinsing fluid curtain to be passed by the substrate 10 and its recesses. The media inlets are here arranged close to or in the replacement gas unit 51 or in the inlet portion and close to the gas inlets. Also in this embodiment, the device 50 for plating a recess in a substrate 10 according to the present invention comprises a reservoir of a plating fluid 40a (not shown) for filling and plating the recesses (and the substrate 10). The substrate 10 is immersed in the plating fluid 40a, which is in this case not the processing fluid 40. The media inlets are here spaced apart from the plating fluid 40a.

In FIG. 4, the gas nozzles 53 for the replacement gas and the media inlets for the rinsing fluid 40b are moveably arranged. The gas nozzles 53 may move together as a nozzle unit or independent of each other. They are moveable perpendicular to a longitudinal direction of the substrate 10 and they can be driven by means of a drive unit in the chamber wall or a drive unit entering the chamber through the same opening also used by the substrate 10.

Figure 5A:
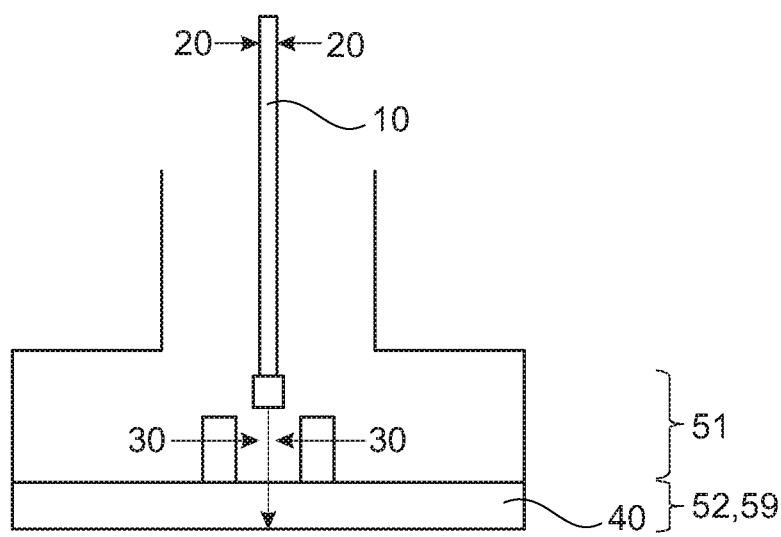
FIGS. 5a, 5b and 5c show schematically and exemplarily an embodiment of a device according to the invention for plating a recess in a substrate.
Figure 5B:
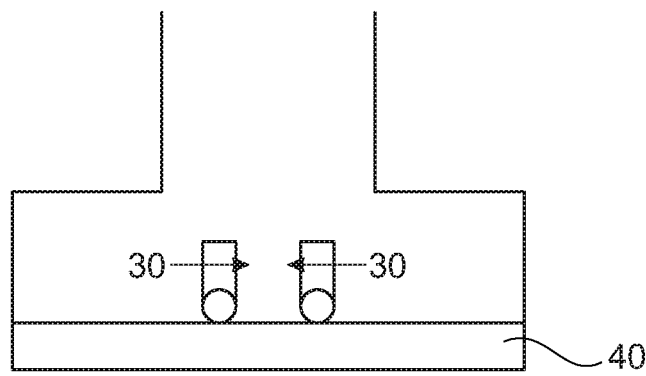
Figure 5C:
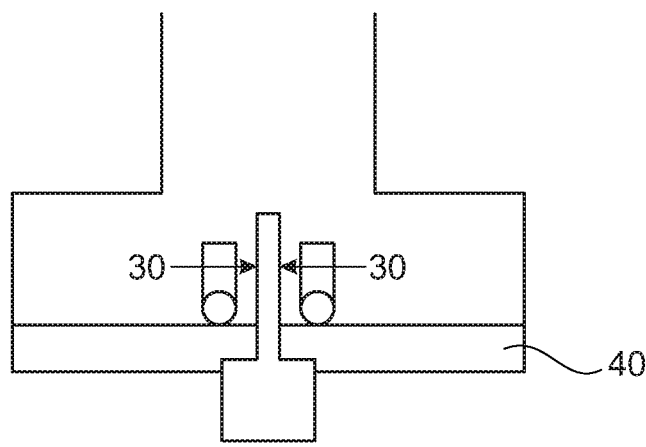

As discussed above and shown in FIGS. 2 to 4, it is an option to provide the gas inlets and/or the media inlets with a distance from the plating fluid 40a close to or in the replacement gas unit 51 or in the inlet portion. As another option and as shown in FIGS. 5a to 5c, the gas inlets for the replacement gas 30 can be arranged directly above and in contact with the processing fluid 40 or the plating fluid 40a. The substrate 10 is then subjected to the replacement gas 30 and immersed in the processing fluid 40 or the plating fluid 40a contained in the reservoir to plate the recesses. Not shown, but also possible is an arrangement of media inlets for the rinsing fluid 40b directly above and in contact with the plating fluid 40a.

Figure 6A:
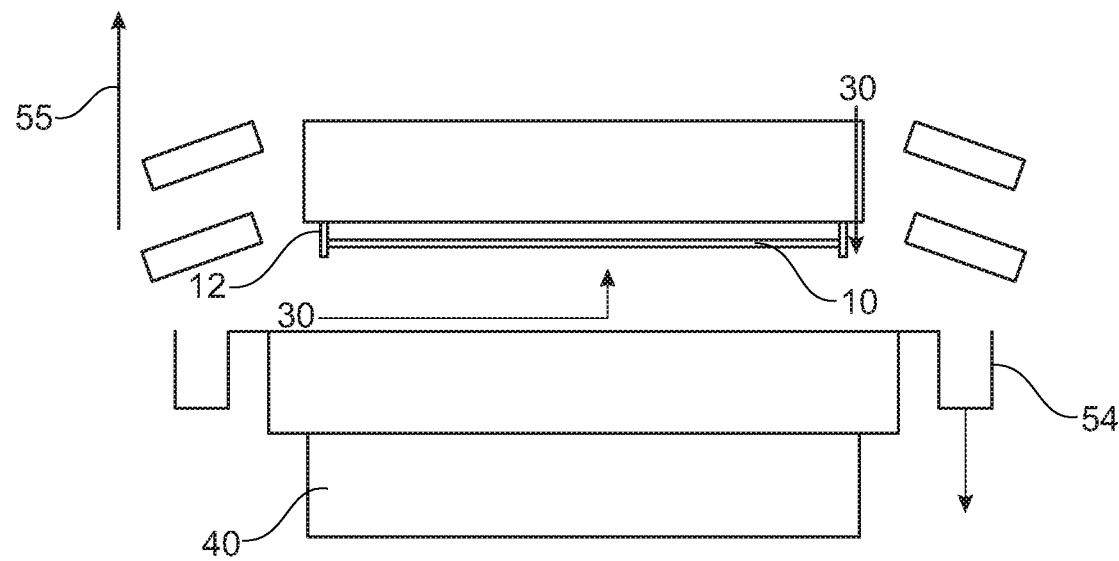
FIGS. 6a, 6b and 6c show schematically and exemplarily an embodiment of a device according to the invention for plating a recess in a substrate.

While FIGS. 2 to 5 show a vertical plating system, FIG. 6a shows a horizontal plating system, in which the substrate 10 is horizontally inserted into a horizontal plating chamber. The plating chamber is then filled with the replacement gas 30 and, afterwards, the substrate 10 is immersed into the processing fluid 40 also contained in the plating chamber. The replacement gas 30 is here provided via chamber walls and via the substrate holder 12.

Figure 6B:
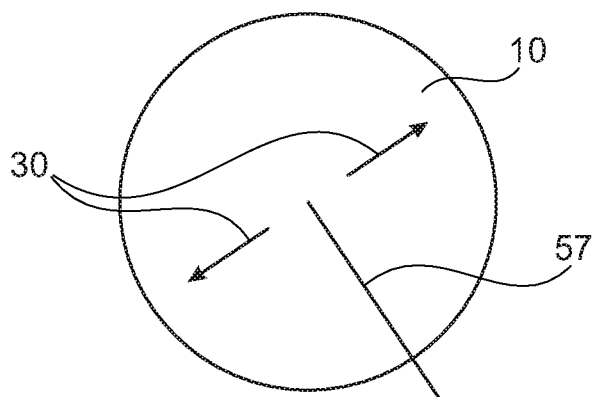
Figure 6C:
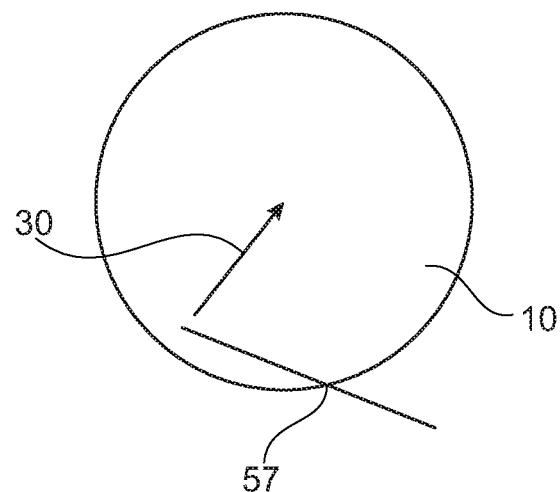

As shown in FIGS. 6b and 6c, the replacement gas 30 may also be provided via an arm-shaped member 57. The arm-shaped member 57 can also apply the rinsing fluid 40b, an initiating agent and/or a chemically active substance to the recess and/or the substrate 10. The substrate 10 is here rotatable relative to the arm-shaped member 57 and the movement between the substrate 10 and the arm-shaped member 57 is a record player like motion. These gases and/or fluids are preferably applied from an outer, larger dimension or circumference to an inner, smaller dimension or circumference of the substrate 10.

Figure 7:
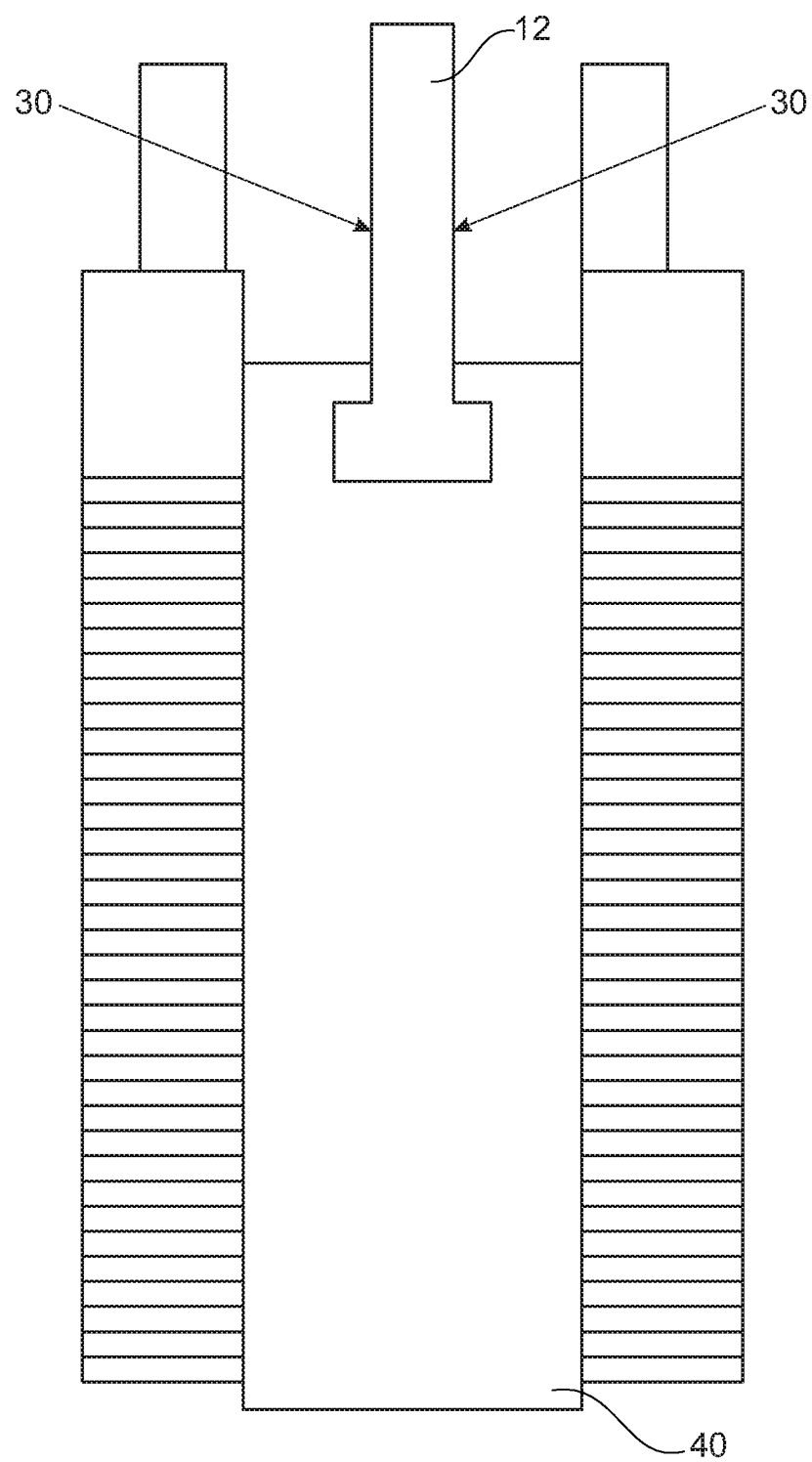
FIG. 7 shows schematically and exemplarily an embodiment of a device according to the invention for plating a recess in a substrate.

FIG. 7 shows a high speed plating system, in which the replacement gas unit 51 and in particular the gas inlets and/or the media inlets are integrated into a substrate holder 12 holding the substrate 10. The gas inlets and the media inlets (the latter not shown) are arranged at a top portion of the substrate holder 12 and thereby in the inlet portion of the plating device 50.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A device (50) for plating a recess in a substrate (10), comprising:
    a replacement gas unit (51) configured to apply a replacement gas (30) to a recess in a substrate (10) to replace an amount of ambient gas (20) in the recess to at least partially clear the recess from the ambient gas (20),
    a processing fluid unit (52) configured to apply a processing fluid (40) to the recess, wherein the replacement gas (30) dissolves in the processing fluid (40) to at least partially clear the recess from the replacement gas (30), and
    a plating unit (59) configured to plate the recess in the substrate (10), wherein the replacement gas unit (51) is directly above the processing fluid unit (52) and the plating unit (59).

2. Device (50) according to claim 1, wherein the processing fluid unit (52) comprises the plating unit (59) and the processing fluid (40) comprises a plating fluid (40a) configured to plate the recess in the substrate (10).

3. Device (50) according to claim 1, wherein the processing fluid unit (52) comprises a rinsing unit (60) and the processing fluid (40) comprises a rinsing fluid (40b) configured to rinse the recess.

4. Device (50) according to claim 3, wherein the replacement gas unit (51) and/or the rinsing unit (60) are arranged in contact with the plating fluid (40a).

5. Device (50) according to claim 4, wherein the replacement gas unit (51) and/or the rinsing unit (60) are floating in the plating fluid (40a).

6. Device (50) according to claim 5, wherein the replacement gas unit (51) and/or the rinsing unit (60) are arranged at a distance to the plating fluid (40a).

7. Device (50) according to claim 6, wherein the two or more gas nozzles (53) are configured to generate a replacement gas cushion or replacement gas curtain to be passed by the recess of the substrate (10).

8. Device (50) according to claim 7, wherein the replacement gas unit (51) further comprises a drain (54) and/or an exhaust (55).

9. Device (50) according to claim 8, wherein the replacement gas unit (51) is an arm-shaped member (57), and wherein the arm-shaped member (57) and the substrate (10) are rotatable relative to each other.

10. Device (50) according to claim 9, wherein the arm-shaped member (57) is configured to apply the replacement gas (30), the rinsing fluid (40b), an initiating agent and/or a chemically active substance to the recess and/or the substrate (10).

11. Device (50) according to claim 10, wherein the replacement gas unit (51) is integrated into a substrate holder (12) configured to hold the substrate (10).

12. A system (70) for plating a recess in a substrate (10) comprising
    the device (50) for plating the recess in the substrate (10) as in any one of the preceding claims, and
    a device control (71), wherein the device control (71) is configured to control a gas replacement in the recess of the substrate (10), an application of the processing fluid (40) to the recess and/or the plating of the recess.

* * * * *